(12) United States Patent
Matsumoto et al.

(10) Patent No.: US 9,699,893 B2
(45) Date of Patent: Jul. 4, 2017

(54) ELASTIC FLEXIBLE SUBSTRATE AND METHOD FOR MANUFACTURING THE SAME

(71) Applicant: Panasonic Intellectual Property Management Co., Ltd., Osaka (JP)

(72) Inventors: Takashi Matsumoto, Osaka (JP); Tetsuyoshi Ogura, Osaka (JP); Daisuke Wakuda, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 156 days.

(21) Appl. No.: 14/626,936

(22) Filed: Feb. 20, 2015

(65) Prior Publication Data
US 2015/0282295 A1    Oct. 1, 2015

(30) Foreign Application Priority Data
Mar. 31, 2014    (JP) ................. 2014-073577

(51) Int. Cl.
| H05K 1/00 | (2006.01) |
| H05K 1/02 | (2006.01) |
| H05K 3/00 | (2006.01) |
| H05K 3/14 | (2006.01) |
| H05K 1/11 | (2006.01) |
| H05K 1/18 | (2006.01) |
| H05K 3/16 | (2006.01) |

(52) U.S. Cl.
CPC ........... *H05K 1/028* (2013.01); *H05K 1/0283* (2013.01); *H05K 3/0044* (2013.01); *H05K 3/14* (2013.01); *H05K 1/115* (2013.01); *H05K 1/181* (2013.01); *H05K 1/189* (2013.01); *H05K 3/16* (2013.01); *H05K 2201/055* (2013.01); *H05K 2201/09063* (2013.01); *H05K 2201/09081* (2013.01); *H05K 2201/09854* (2013.01); *H05K 2201/10083* (2013.01); *H05K 2201/10151* (2013.01); *H05K 2201/10901* (2013.01); *Y10T 29/49162* (2015.01)

(58) Field of Classification Search
CPC ........ H05K 1/028; H05K 1/187–1/189; H05K 1/0393; H05K 1/118
USPC .................. 361/749–750, 803; 174/250–262
See application file for complete search history.

(56) References Cited

U.S. PATENT DOCUMENTS

| 6,447,314 B1 * | 9/2002 | Kato .................... G06F 1/1616 361/755 |
| 6,655,014 B1 * | 12/2003 | Babini .................. H02G 1/085 174/68.3 |

(Continued)

FOREIGN PATENT DOCUMENTS

| JP | 1-135758 U | 9/1989 |
| JP | 6-140727 | 5/1994 |
| JP | 2009-224508 | 10/2009 |

*Primary Examiner* — Tuan T Dinh
(74) *Attorney, Agent, or Firm* — McDermott Will & Emery LLP

(57) ABSTRACT

An elastic flexible substrate including an insulating film base material provided with a wire is provided. In the insulating film base material, a plurality of slits are provided with a predetermined space left therebetween, the insulating film base material has a bellows shape in which the insulating film base material is bent or curved by using the slits as base points, and the slits are deformed when the insulating film base material is stretched.

17 Claims, 11 Drawing Sheets

(56) References Cited

U.S. PATENT DOCUMENTS

| | | | | |
|---|---|---|---|---|
| 2005/0018409 A1* | 1/2005 | Hirakata | ................ | H05K 1/028 |
| | | | | 361/752 |
| 2006/0131064 A1* | 6/2006 | Hagiwara | ........... | H01L 23/4985 |
| | | | | 174/250 |
| 2008/0078573 A1* | 4/2008 | Hu | ....................... | H05K 1/0219 |
| | | | | 174/262 |
| 2009/0166065 A1* | 7/2009 | Clayton | ................ | H05K 1/189 |
| | | | | 174/254 |
| 2011/0222815 A1* | 9/2011 | Hamana | ............... | G02B 6/4214 |
| | | | | 385/14 |
| 2012/0285723 A1* | 11/2012 | Gundel | ................ | H01B 7/0861 |
| | | | | 174/113 R |
| 2013/0032381 A1* | 2/2013 | Hiyama | ................ | H05K 1/028 |
| | | | | 174/254 |
| 2013/0333919 A1* | 12/2013 | Nguyen | ............... | H05K 9/0015 |
| | | | | 174/126.1 |

* cited by examiner

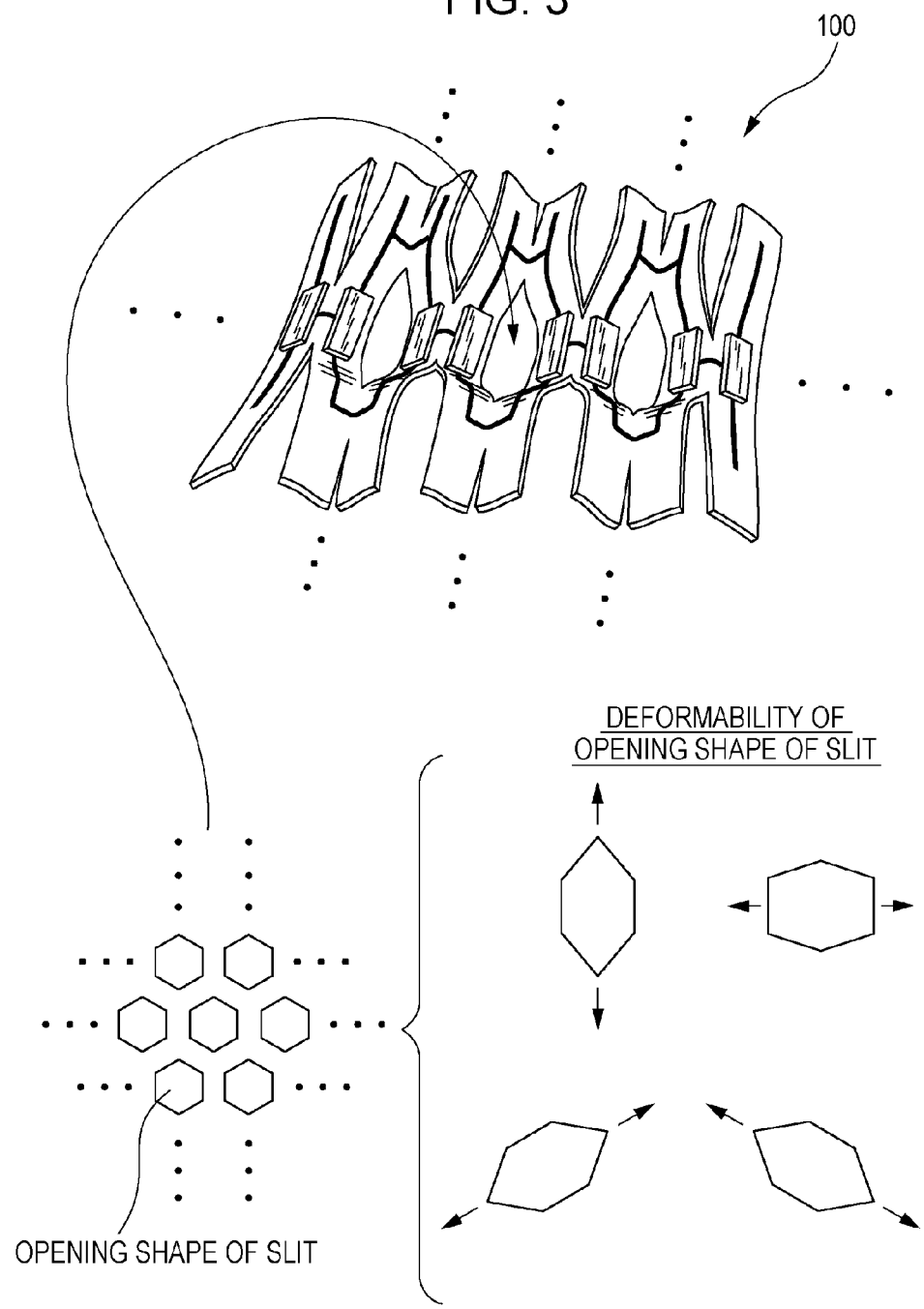

FIG. 4A1
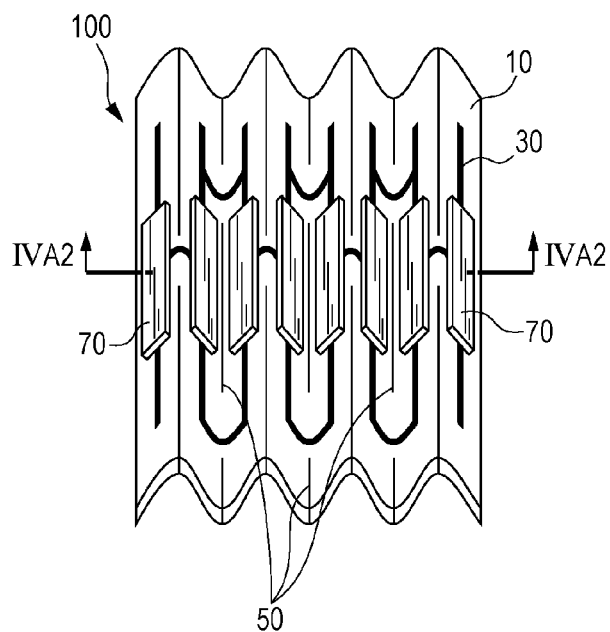
FIG. 4A2
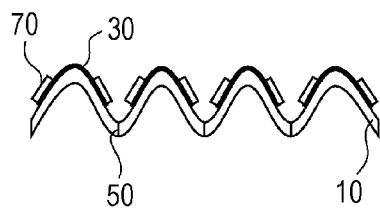
FIG. 4B1
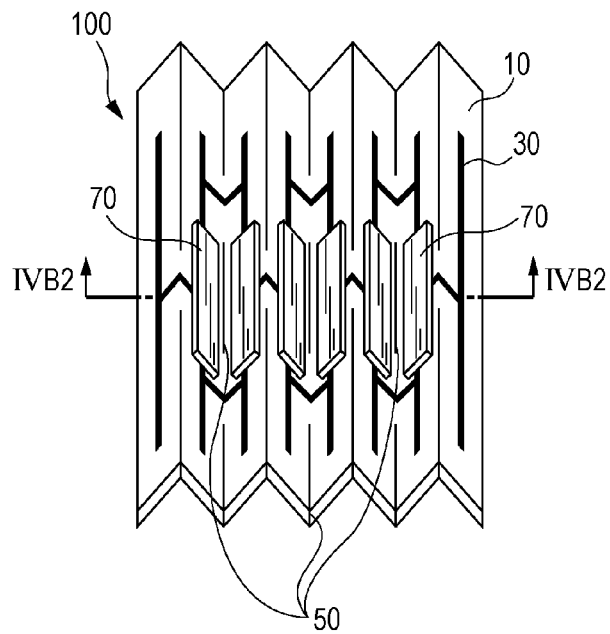
FIG. 4B2
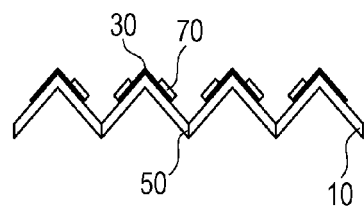

CURVED BELLOWS SHAPE

ELASTIC FLEXIBLE SUBSTRATE AND METHOD FOR MANUFACTURING THE SAME

CROSS REFERENCES TO RELATED APPLICATIONS

This Application claims priority to Japanese Patent Application No. 2014-073577, filed on Mar. 31, 2014, the contents of which are hereby incorporated by reference.

BACKGROUND

1. Technical Field

The present disclosure relates to elastic flexible substrates and methods for manufacturing the elastic flexible substrate. More specifically, the present disclosure relates to an elastic flexible substrate which can be used as a wiring substrate and a circuit substrate and also to a method for manufacturing such an elastic flexible substrate.

2. Description of the Related Art

As the size and thickness of electronic devices are reduced, a flexible substrate is used in various types of electronics equipment. Such a flexible substrate is often used after being bent from the viewpoint of space-saving. Thus, a flexible substrate which is thin as a whole has flexibility.

Recently, flexible substrates have been expected to be used in various fields, and the use of the flexible substrates, not only in the common field of electronics equipment, but also in the fields of wearable devices, robots, health care, medicine, nursing care, and so forth, has been studied. For example, the use of the flexible substrates for a sensor which is placed on a free-form surface such as the surface of a palm of a hand, a touch panel having a relatively large curved form such as a "spherical surface", a sensor which is to be incorporated into clothing items and so forth that are bent and expanded and made to contract when used, and so forth has also been studied.

Japanese Unexamined Utility Model Registration Application Publication No. 1-135758, Japanese Unexamined Patent Application Publication No. 2009-224508, and Japanese Unexamined Patent Application Publication No. 6-140727 are examples of related art.

SUMMARY

The existing flexible substrate has flexibility or bendability but does not have expansion and contraction properties.

In one general aspect, the techniques disclosed here feature an elastic flexible substrate including an insulating film base material and a wire provided on the insulating film base material, in the insulating film base material, a plurality of slits are provided with a predetermined space left therebetween, the insulating film base material has a bellows shape in which the insulating film base material is bent or curved by using the slits as base points, and the slits are deformed when the insulating film base material is stretched.

In accordance with one aspect of the present disclosure, the elastic flexible substrate of the present disclosure has expansion and contraction properties.

These general and specific aspects may be implemented using a system, a method, and a computer program, and any combination of systems, methods, and computer programs.

BRIEF DESCRIPTION OF THE DRAWINGS

FIG. 3 is a perspective view and a plan view for explaining the "deformability of the opening shape of a slit" in the elastic flexible substrate of the present disclosure;

FIGS. 4A1 to 4B2 are perspective views schematically depicting the configuration of the elastic flexible substrate of the present disclosure, FIG. 4A1 being a diagram depicting a bellows shape obtained as a result of an insulating film base material being curved by using slits as base points, FIG. 4A2 being a cross sectional view taken on the line IVA2-IVA2 in FIG. 4A1, FIG. 4B1 being a diagram depicting a bellows shape obtained as a result of the insulating film base material being bent by using the slits as base points, and FIG. 4B2 being a cross sectional view taken on the line IVB2-IVB2 in FIG. 4B1;

DETAILED DESCRIPTION

Figure 1:
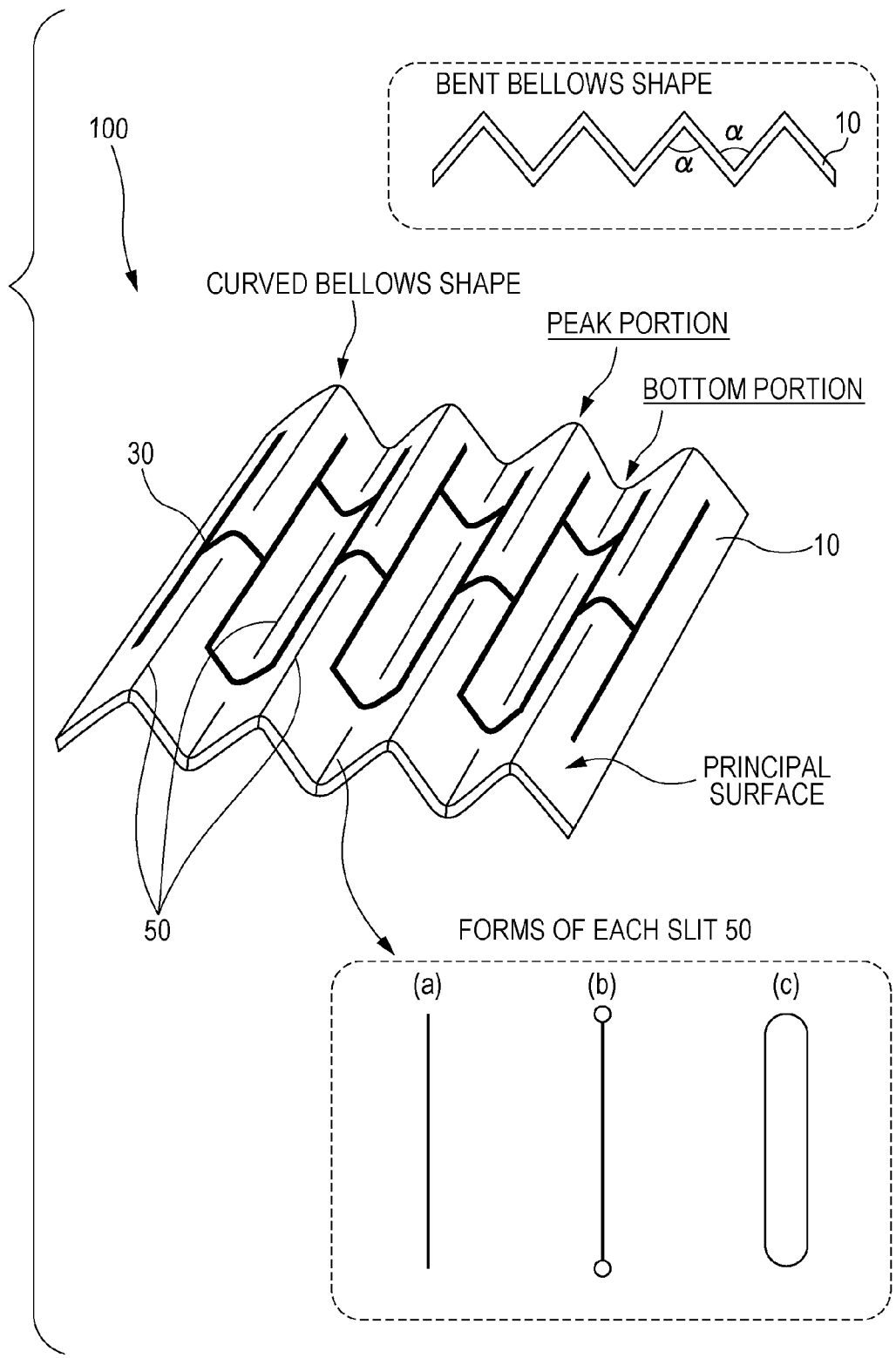
FIG. 1 is a perspective view schematically depicting the configuration of an elastic flexible substrate of the present disclosure.

Underlying Knowledge Forming Basis of the Present Disclosure

The disclosers of the present disclosure have carefully studied the matters related to the flexibility and the expansion and contraction properties of a wiring substrate and devised the present disclosure. Therefore, the present disclosure will be first described.

As a way to provide a flexible substrate with expansion and contraction properties, the flexible substrate itself may be processed into a meandering shape (for example, see Japanese Unexamined Utility Model Registration Application Publication No. 1-135758 and Japanese Unexamined Patent Application Publication No. 2009-224508 (in particular, FIG. 1)). However, the disclosers of the present disclosure have found out that such an elastic flexible substrate is accompanied by an inconvenient event. Specifically, the disclosers of the present disclosure have found out that profound "distortion" occurs at the time of expansion and contraction in a flexible substrate obtained by processing a flexible substrate into a meandering shape and therefore such a flexible substrate is not always suitable for a device which is required to have electronic devices placed in a "regular arrangement form". That is, if a plurality of devices such as image display devices or sensors are provided in the "flexible substrate obtained by processing a flexible substrate into a meandering shape", these devices become unable to maintain the "regular arrangement form" due to the profound "distortion" which occurs at the time of expansion and contraction.

Since the present disclosure has been devised in view of the matters described above, a flexible substrate of the present disclosure, the flexible substrate having expansion and contraction properties, has been devised from a new direction, not devised as an extension of the existing technology.

Elastic Flexible Substrate of the Present Disclosure

Hereinafter, an elastic flexible substrate according to one embodiment of the present disclosure will be described with reference to the drawings. It is to be noted that various elements depicted in the drawings are schematically depicted only for an understanding of the present disclosure and may be different from the actual elements in a dimensional ratio, an appearance, and so forth.

In FIG. 1, an elastic flexible substrate 100 of the present disclosure is schematically depicted. The elastic flexible substrate 100 of the present disclosure includes an insulating film base material 10 and a wire 30. As depicted in the drawing, the insulating film base material 10 is a fundamental component element forming the general shape of the elastic flexible substrate 100. The wire 30 is provided on a principal surface of the insulating film base material 10 and may form a conductor circuit.

The elastic flexible substrate 100 of the present disclosure has a plurality of slits 50 which are formed with a predetermined space left therebetween and are provided in the insulating film base material 10. The insulating film base material 10 has a bent or curved bellows shape obtained as a result of the insulating film base material 10 being bent or curved by using such slits as base points. That is, the insulating film base material 10 has a bent form or a curved form obtained as a result of the insulating film base material 10 being repeatedly bent or curved into a bellows shape, and the slits appear at such bent or curved spots.

The "bent form" and the "curved form" will be described. In the form depicted in the perspective view of FIG. 1, the "curved bellows shape" obtained as a result of the insulating film base material 10 being curved by using slits 50 as base points is depicted. On the other hand, a form depicted in an upper portion of the drawing, the form enclosed by a broken line, depicts the "bent bellows shape" obtained as a result of the insulating film base material 10 being bent by using the slits 50 as base points (see also FIGS. 4A1 to 4B2). In both the "bent" form and the "curved" form, the insulating film base material is locally bent and this "bending" provides a "bellows shape".

As is clear from the embodiment depicted in the drawing, the elastic flexible substrate 100 of the present disclosure has a form in which local spots of the insulating film base material 10, the local spots extending in a longitudinal direction of the slits 50, are bent or curved (as for the "curved form", such local spots of the insulating film base material 10 each have the "most highly-curved form" in a slit formation portion). Due to such a feature, in the elastic flexible substrate 100 of the present disclosure, the slits are located in a "peak portion" and a "bottom portion" in the bellows of the insulating film base material 10.

In the present specification, the "slit" means a "notch" provided in a principal surface of the insulating film base material 10 and, more specifically, means a notch provided in such a way as to penetrate the insulating film base material 10. A direction in which each slit 50 extends, that is, the longitudinal direction of each slit 50 corresponds to a direction in which the bent spot or the most highly-curved spot of the insulating film base material 10 extends. That is, each slit 50 extends along each of the "peak portion" and the "bottom portion" in the bellows of the insulating film base material 10.

Moreover, in the present specification, the expression such as "a plurality of slits with a predetermined space left therebetween" refers to an embodiment in which a plurality of slits are provided for each of the "peak portion" and the "bottom portion" in the bellows of the insulating film base material. Therefore, the "predetermined space" here virtually means a "space" defined from the viewpoint of obtaining bellows by repeatedly bending or curving something. That is, as long as a bellows shape can be obtained by slits, the distance between adjacent two slits in a plurality of slits does not have to be "constant" and may be "inconstant". Furthermore, the distance between adjacent two slits in a plurality of slits may have "periodical regularity".

A specific "predetermined space" between a plurality of slits is, for example, 50 μm to 5 mm or 250 μm to 2.5 mm (in other words, the period of a mountain portion or a valley portion in the bellows shape is, for example, 100 μm to 10 mm or 500 μm to 5 mm). While the maximum expansion rate of the elastic flexible substrate tends to be increased if such a "predetermined space" is reduced, the maximum expansion rate of the elastic flexible substrate tends to be reduced if the "predetermined space" is increased.

Figure 2A:
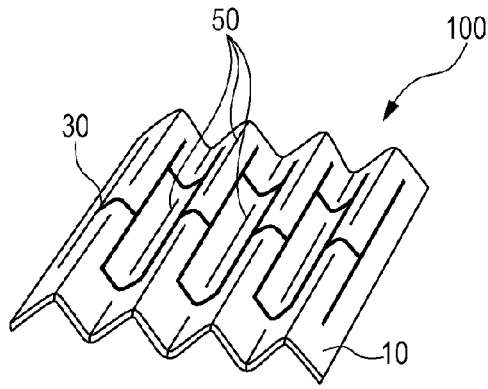
FIGS. 2A to 2C are perspective views schematically depicting the expandability and contractibleness of the elastic flexible substrate of the present disclosure, FIG. 2A being a diagram depicting a state in which a stretching force is not applied, FIG. 2B being a diagram depicting a state in which the stretching force is applied and the bellows shape is flattened, and FIG. 2C being a diagram depicting a state in which the stretching force is applied and slits are deformed.
Figure 2B:
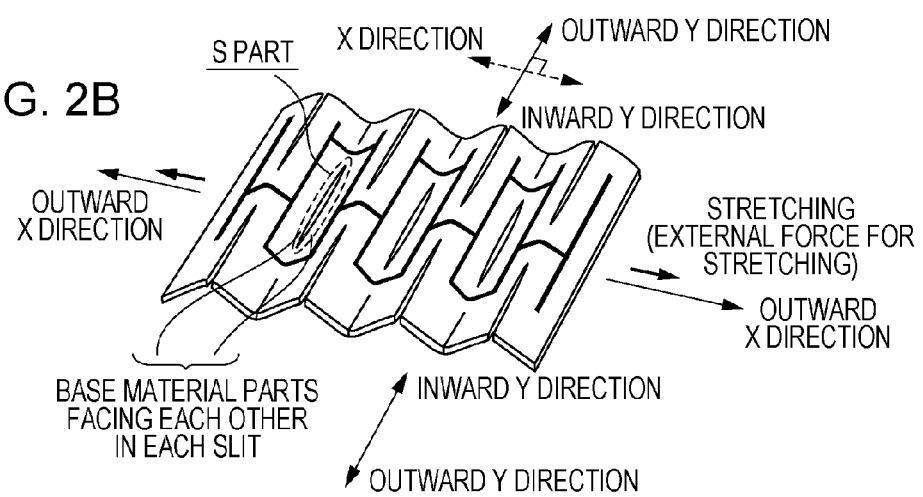
Figure 2C:
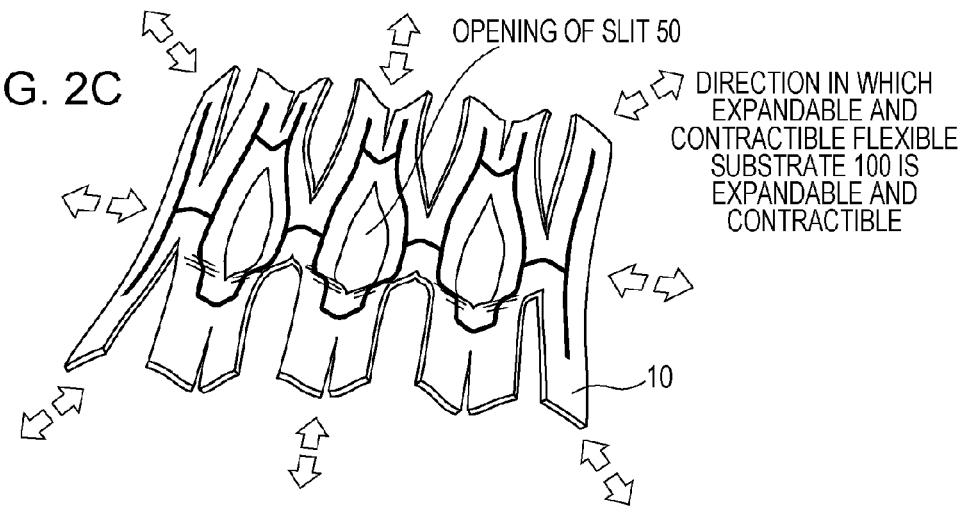

In the elastic flexible substrate 100 of the present disclosure, the slits 50 are deformed when the insulating film base material 10 is stretched. In one specific embodiment, as depicted in FIGS. 2A to 2C, when a stretching external force is applied to the insulating film base material 10 having a bellows shape, the bending or curving of the "bellows" disappears in such a way that the "bellows" become flat, and the shapes of the slits 50 of the insulating film base material 10 change. With the disappearance of the bending or curving of the "bellows", in the elastic flexible substrate 100, the bent or curved parts are expanded, and the elastic flexible substrate 100 is further expanded due to a change in the shapes of the slits. Then, when the external force applied to the stretched insulating film base material 10 is removed, the insulating film base material 10 contracts as the slits 50 are restored to the original shapes, and the insulating film base material 10 further contracts as the insulating film base material 10 is bent or curved to restore the "bellows shape". That is, as a result of the slits returning to the original shapes, the elastic flexible substrate 100 contracts, and, then, or, with that, as a result of the insulating film base material 10 being restored in such a way that the insulating film base material 10 is bent or curved again, the elastic flexible substrate 100 further contracts.

As described above, the degree of expansion and contraction of the elastic flexible substrate 100 of the present disclosure is particularly high due to the effects of both the "bellows shape" and the "slits". In an embodiment, when the insulating film base material is stretched, the slits are deformed in such a way as to be opened. That is, as depicted in FIG. 2C, while the insulating film base material 10 is expanded as a result of the slits 50 provided in the insulating film base material 10 getting larger as if the slits 50 were opened, the temporarily expanded insulating film base material 10 contacts as a result of the slits 50 which got larger being restored to the original forms. The shape of an opening formed in the base material as a result of the slit getting larger (that is, the shape of the outline of the base material defining the opening of each slit) is not limited to a particular shape and may be, for example, a polygonal shape such as a hexagonal shape.

The specific degree of expansion and contraction will be illustrated. For example, the size (the maximum expansion size) of the elastic flexible substrate expanded to a maximum extent is, for example, about 120% to 400% or about 130% to 300% of the size thereof in the original state.

Here, the fact that the insulating film base material is expanded as a result of the slits getting larger and being opened will be described in detail. The larger the slits get, that is, the greater the extent of the openings of the slits, the higher the expansion rate of the elastic flexible substrate tends to become. In other words, while the maximum expansion size of the elastic flexible substrate tends to be increased if the size of each of the slits in the longitudinal direction thereof, the slits formed in the insulating film base material, is large, the maximum expansion size of the elastic flexible substrate tends to be reduced if the size of each of the slits in the longitudinal direction thereof is small.

As is clear from the embodiment depicted in the drawing, in the present specification, "the slits are deformed" means that a base material part (in FIG. 2B, a region of the insulating film base material, the region represented as an "S part") defining each slit is displaced. More specifically, "the slits are deformed" means that the base material parts facing each other in each slit "move away from" each other or "become misaligned".

In the elastic flexible substrate 100 of the present disclosure, an expansion and contraction direction is not limited to one direction and can exhibit expansion and contraction properties in various directions (see FIG. 2C). This point will be described specifically. In the present disclosure, the slits are deformed when the elastic flexible substrate having a bellows shape is stretched, and, since such slit deformation has a high degree of flexibility, it is possible to expand the elastic flexible substrate in various directions. More specifically, as a result of the base material parts facing each other in each slit being displaced in such a way that the base material parts "move away from" each other and at the same time "become misaligned", the insulating film base material is allowed to be expanded in a direction in which the base material parts move away from each other and, in addition to that direction, in an oblique direction with respect to that direction. Then, as a result of the "base material parts facing each other in each slit", the base material parts moving away from each other in such a way as to become misaligned, being restored to the original form, the insulating film base material which was temporarily expanded in the oblique direction contracts.

This means that the opening shape of the slit is deformable with the expansion and contraction of the insulating film base material as depicted in FIG. 3. Since the opening shape of the slit is deformable as described above, the expansion and contraction direction of the elastic flexible substrate 100 of the present disclosure is not limited to one direction and the elastic flexible substrate 100 has expansion and contraction properties in various directions.

The elastic flexible substrate of the present disclosure may be an elastic flexible substrate in which the whole of an insulating film base material is held or fixed by using an insulating material (for example, a resin material or a resin material having expansion and contraction properties). For example, if the insulating film base material is fixed in a state in which the insulating film base material is a little stretched in a direction (which is referred to as an "outward X direction") in which the insulating film base material is stretched in order to flatten the bellows shape, the elastic flexible substrate is brought into a state in which the elastic flexible substrate has a little contracted in an "inward Y direction perpendicular to the outward X direction" (see FIG. 2B for the "outward X direction" and the "inward Y direction"). The elastic flexible substrate in such a state is expandable and contractible not only in the X direction and the Y direction, but also in a direction obtained by combining these directions (specifically, a direction of a resultant vector of a vector of the X direction and a vector of the Y direction).

A more specific embodiment will be illustrated. In the elastic flexible substrate of the present disclosure, the insulating film base material may be fixed in a state in which the bellows shape is flattened but not completely flattened. In such a case, if each slit has got larger and has been opened (for example, if the shape of each slit opening has become a hexagonal shape), an expandable and contractible resin material may be supplied in such a way that the space of each slit opening described above is filled with the expandable and contractible resin material, and the insulating film base material may be fixed by doing so. The elastic flexible substrate obtained in this manner is expanded in a large amount in the outward X direction and is expanded also in the outward Y direction perpendicular to the outward X direction.

In an embodiment, as depicted in FIGS. 4A1 to 4B2, the elastic flexible substrate 100 of the present disclosure includes an electronic device 70. Specifically, the electronic device 70 is provided on a principal surface of the insulating film base material 10 in such a way as to be electrically connected to the wire 30. As depicted in the drawing, for example, a plurality of electronic devices 70 of the same type may be provided on a principal surface (a base material principal surface other than a slit formation region) of the insulating film base material 10.

Figure 5A:
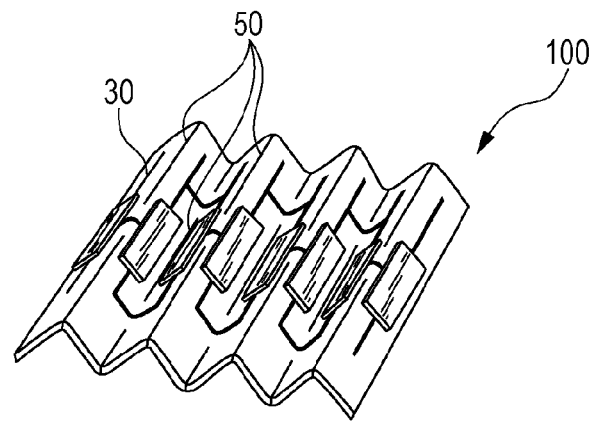
FIGS. 5A to 5C are perspective views schematically depicting the expandability and contractibleness of the elastic flexible substrate of the present disclosure, the elastic flexible substrate provided with a plurality of electronic devices, FIG. 5A being a diagram depicting a state in which the stretching force is not applied, FIG. 5B being a diagram depicting a state in which the stretching force is applied and the bellows shape is flattened, and FIG. 5C being a diagram depicting a state in which the stretching force is applied and the slits are deformed.
Figure 5B:
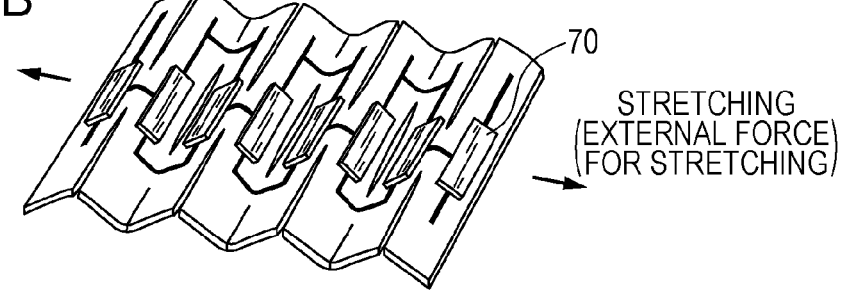
Figure 5C:
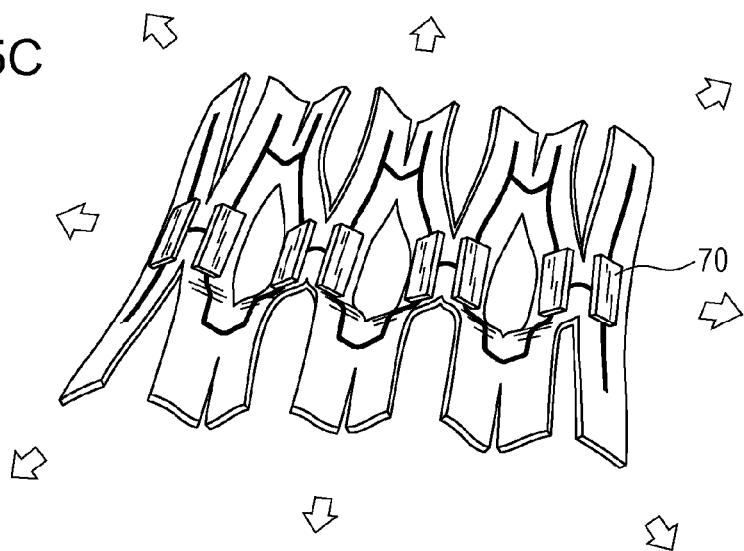

As is clear from an embodiment depicted in FIGS. 5A to 5C, in the elastic flexible substrate 100 in an embodiment, a plurality of electronic devices 70 are provided in a "regular arrangement form" (that is, an "orientation of a regular device arrangement"). In particular, the elastic flexible substrate 100 of the present disclosure easily maintains the "regular arrangement form" at the time of expansion and contraction thereof. That is, as depicted in the embodiment of FIGS. 5A to 5C, even when the elastic flexible substrate 100 is stretched, profound local distortion does not occur in spots of the insulating film base material 10 in which the electronic devices 70 are placed (and, if distortion occurs, such distortion becomes distortion with "high uniformity" in the whole base material), and the arrangement form of the plurality of electronic devices 70 can maintain the regularity thereof as a whole. This means that the properties of the electronic devices 70 can be used evenly in the elastic flexible substrate 100. Therefore, it is possible to use the properties of the electronic devices efficiently, which results in the simplification of substrate design and the substrate manufacturing process. Thus, in the present disclosure, it is possible to improve the performance of the elastic flexible substrate and reduce the cost of the elastic flexible substrate.

Various component elements of the present disclosure will be described individually. In the elastic flexible substrate of the present disclosure, the "insulating film base material 10" is a support member on which any one of the wire 30 and the electronic device 70 and so forth or both are provided. Since the insulating film base material 10 is formed as a "film", the insulating film base material 10 has a thin form and, in particular, has a small thickness that provides the insulating film base material 10 with flexibility. For example, the specific thickness of the insulating film base material 10 is in, for example, the range about 5 μm to about 1000 μm or the range about 30 μm to about 100 μm (for example, about 40 μm). Moreover, since the insulating film base material 10 has "insulating properties", the insulating film base material 10 is formed of a material having electrical insulating properties. For example, the insulating film base material 10 may be at least one type of material selected from a group consisting of polyethylene terephthalate (PET), polyethylene naphthalate (PEN), polyether ether ketone (PEEK), polyimide (PI), and so forth. For example, the insulating film base material 10 may be formed of polyimide. Depending on the use of the elastic flexible substrate, the insulating film base material 10 may be formed of a transparent material and therefore the insulating film base material 10 may be transparent in visible light.

The overall shape of the insulating film base material 10 is not limited to a particular shape. In an embodiment, the insulating film base material 10 has, on the whole, a belt-like shape in which the longer-side direction thereof corresponds to the main expansion and contraction direction. In such a case, it is possible to provide as many "peak portions" and "bottom portions" as possible in the bellows of the insulating film base material 10 and more slits which are arranged with a predetermined space left therebetween, which eventually makes it possible to achieve greater expansion and contraction properties.

The "wire 30" generally forms a conductor circuit in the elastic flexible substrate. The material of the wire 30 is not limited to a particular material as long as the material has conductivity. For example, examples of the material of the wire 30 include metal materials such as gold (Au), silver (Ag), copper (Cu), nickel (Ni), chrome (Cr), cobalt (Co), magnesium (Mg), calcium (Ca), platinum (Pt), molybdenum (Mo), iron (Fe), and zinc (Zn), conductive oxide materials such as zinc oxide (ZnO), tin oxide ($SnO_2$), indium tin oxide (ITO), fluorine-containing tin oxide (FTO), ruthenium oxide ($RuO_2$), iridium oxide ($IrO_2$), and platinum oxide ($PtO_2$), and conductive polymer materials such as polythiophenes and polyanilines. The thickness of the wire 30 is in, for example, the range about 10 nm to about 1 μm or the range about 30 nm to about 500 nm (for example, about 100 nm).

The wire 30 is provided on the insulating film base material 10, and coating processing or sealing processing may be performed thereon by using an insulating material, for example. Moreover, the wire may be provided on the insulating film base material in a matrix in a "biaxial wire" form. Furthermore, the wire may have an active or passive matrix wire form.

The "electronic device 70" generally forms an electronic circuit component in the elastic flexible substrate. Therefore, any type of the electronic device 70 may be used as long as the electronic device 70 is an electronic circuit component used in the common flexible substrate field. For example, the electronic device 70 may be a semiconductor device, a sensor (for example, a sensor that detects a temperature, pressure, or the like), and an actuator (for example, an actuator that generates vibration). The "semiconductor device" here virtually refers to a luminescence device, a light-receiving device, a diode, a transistor, and so forth. Other specific examples of the electronic device 70 include an IC (for example, a control IC), an inductor, a capacitor, a power device, a chip resistor, a chip capacitor, a chip barrister, a chip thermistor, a chip-like stacked filter, and a connecting terminal.

In the elastic flexible substrate of the present disclosure, the "plurality of slits 50" are provided. That is, a plurality of "through notches" that penetrate the insulating film base material 10 are provided in a principal surface of the insulating film base material 10 with a predetermined space left therebetween.

Figure 6A:
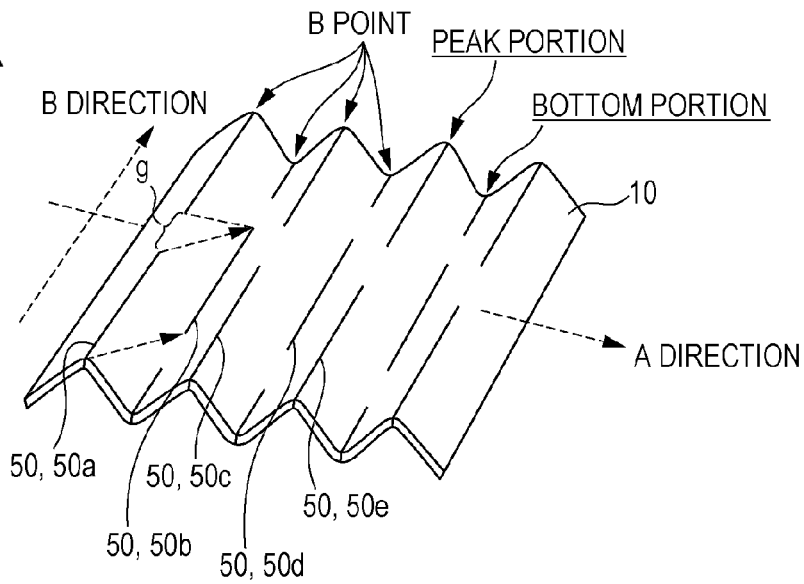
FIGS. 6A to 6C are a perspective view and plan views for explaining the arrangement form of slits, FIG. 6A being a schematic view of an insulating film base material in which slits are formed, FIG. 6B being a plan view for explaining that "two slits which are adjacent to each other in a direction in which a plurality of slits are arranged with a predetermined space left therebetween are not aligned", and FIG. 6C being a plan view for explaining that "at least two slits are provided in each bent spot or most highly-curved spot of the insulating film base material"
Figure 6B:
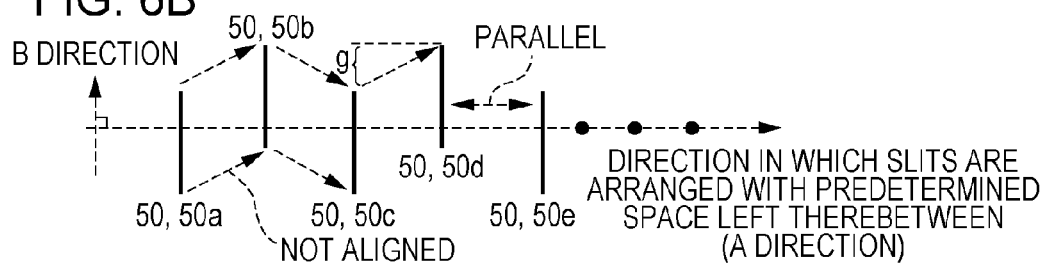
Figure 6C:
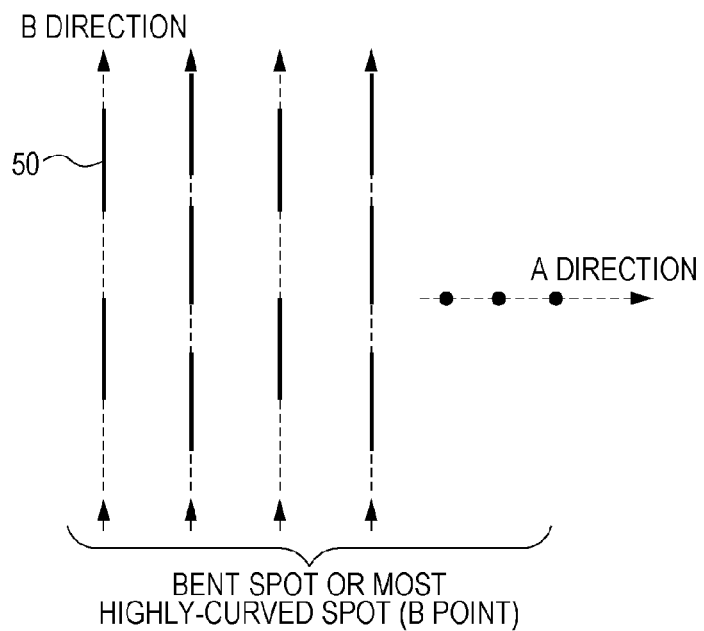

For example, the plurality of slits 50 are arranged in accordance with certain rules. In regard to this point, the plurality of slits may have an arrangement form in which the slits are offset. Specifically, as depicted in FIGS. 6A to 6C, in a direction (an "A direction" in FIG. 6A) in which the plurality of slits 50 are arranged with a predetermined space left therebetween, the two slits which are adjacent to each other may not be aligned (see also FIG. 6B). Moreover, in each of "bent spots" or "most highly-curved spots" of the insulating film base material (a "B point" in FIG. 6A), at least two slits 50 may be provided (see also FIG. 6C). With such a slit arrangement form, the "bellows shape" of the insulating film base material is particularly easily maintained and an opening of the slit appears at the time of expansion and contraction of the elastic flexible substrate.

With reference to FIGS. 6A to 6C, one slit arrangement mode will be described more specifically. As depicted in the drawings, the longitudinal directions of a plurality of slits 50a, 50b, 50c, 50d, 50e, . . . which are arranged with a predetermined space left therebetween are parallel to each other, but the two slits which are adjacent to each other are not aligned. That is, although the slit 50a and the slit 50b extend parallel to a B direction in the drawing, the slit 50a and the slit 50b are offset by an amount corresponding to "g" in the drawing in the A direction (see also FIG. 6B). The same slit arrangement form (the form with the same number of slits, the same placement position, and so forth) may be adopted among a plurality of "peak portions" or "bottom portions" in the bellows of the insulating film base material 10, the "peak portion" and the "bottom portion" may have different slit arrangement forms (the forms with different numbers of slits, different placement positions, and so forth). In regard to this point, an example will be described based on a mode of FIG. 6A. In a spot corresponding to a "peak portion", two slits are provided and each of the two slits extends to the edge of the insulating film base material; in a spot corresponding to a "bottom portion", three slits are provided and only two slits positioned in the outermost positions extend to the edge of the insulating film base material.

Here, the form of each slit 50 will be described. The slits provided in the insulating film base material may have various forms (typically, the width of each slit may be smaller than the width of the wire). The form is not limited to a form (for example, a form (a) depicted in a lower part of FIG. 1) in which each slit extends in a linear fashion and may be a form (for example, a form (b) depicted in the lower part of FIG. 1) in which an end of each slit has a circular shape or a form (for example, a substantially oval form (c) depicted in the lower part of FIG. 1) in which each slit extends in a shape of a wide band. In particular, in the forms (b) and (c) described above, the effect of increasing the strength of the base material around the slit is obtained. That is, it is possible to prevent effectively an inconvenient phenomenon in which a slit splits from an end thereof when the slit is deformed (for example, when the slit is opened in such a way as to get larger) due to the stretching of the insulating film base material.

Hereinafter, a more specific embodiment or a modified embodiment of the elastic flexible substrate of the present disclosure will be described.

First Embodiment

Figure 7:
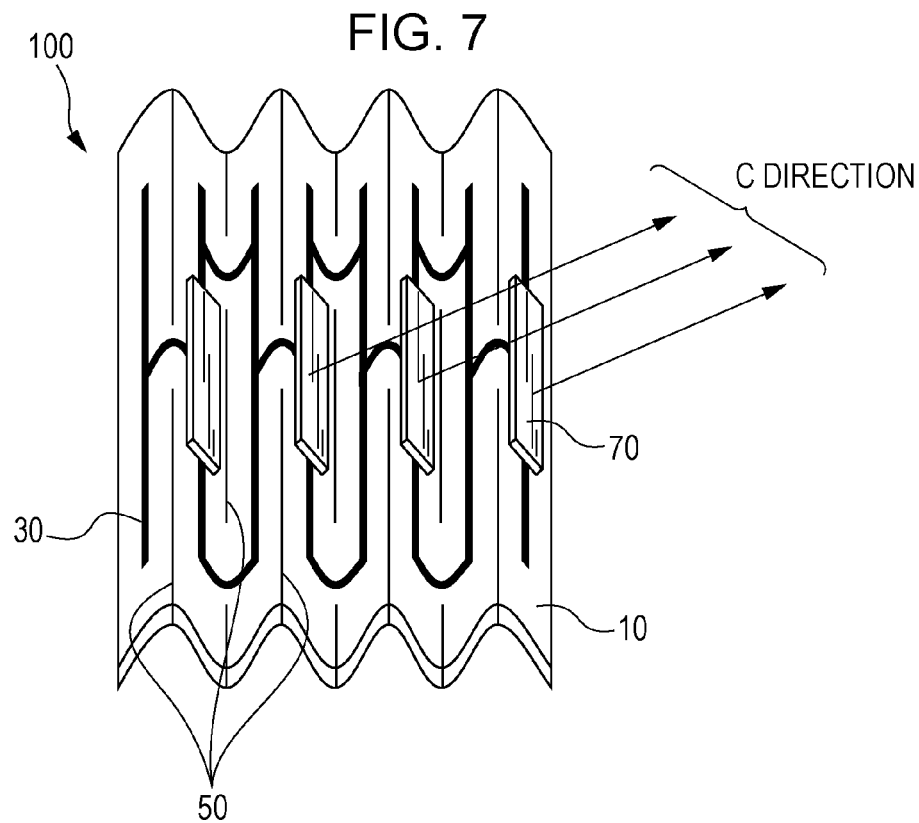
FIG. 7 is a perspective view schematically depicting the configuration of the elastic flexible substrate of the present disclosure, the elastic flexible substrate provided with a plurality of electronic devices.

In FIG. 7, an embodiment of the elastic flexible substrate 100 of the present disclosure is depicted. In such embodiment, in a bellows portion of the insulating film base material 10, the electronic devices 70 are provided only on inclined surfaces which are inclined in the same direction. In such a case, the plurality of electronic devices 70 have a "regular arrangement form", and the plurality of electronic devices 70 are oriented in a single direction (a C direction in FIG. 7), in particular, in the elastic flexible substrate 100. Such a single direction can be maintained even at the time of expansion and contraction of the elastic flexible substrate. That is, even when the elastic flexible substrate 100 is expanded or made to contract, profound local distortion does not occur in the insulating film base material 10 (moreover, if distortion occurs, such distortion becomes distortion with "high uniformity" in the whole base material), and the orientation of the single direction of the plurality of electronic devices 70 is maintained as a whole.

This means that this feature contributes particularly to the implementation of a device in light of an actual mode. For example, when pixels of an image display device such as an organic EL display are provided on the insulating film base material (for example, the inclined surfaces which are inclined in the same direction in the bellows portion described above) of the elastic flexible substrate, it is possible to align EL portions corresponding to displaying units in a single direction.

Second Embodiment

Figure 8:
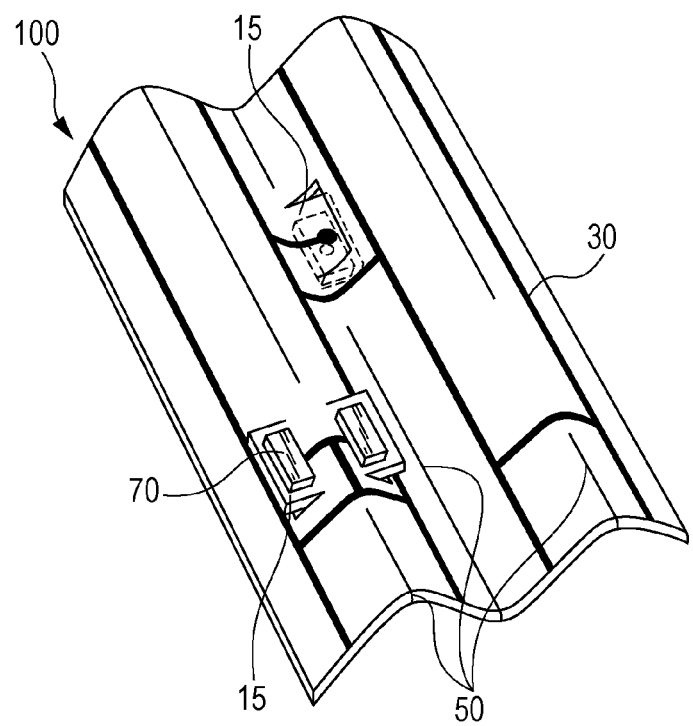
FIG. 8 is a perspective view schematically depicting the configuration of the elastic flexible substrate of the present disclosure, the elastic flexible substrate provided with protrusions.

In FIG. 8, another embodiment of the elastic flexible substrate 100 of the present disclosure is depicted. In such embodiment, the elastic flexible substrate 100 further includes a protrusion 15. More specifically, in the elastic flexible substrate 100, the protrusion 15 which is a part of a principal surface of the insulating film base material 10, the part which is bent after being cut from a principal surface of the insulating film base material 10, is provided. As depicted in the drawing, the protrusion 15 has a form that makes the protrusion 15 project outward from the insulating film base material having the bellows shape. For example, in one embodiment, a direction in which the protrusion 15 projects (that is, a direction in which the protrusion 15 extends) is substantially parallel to the direction in which the insulating film base material is stretched in order to flatten the bellows shape thereof. That is, when the elastic flexible substrate 100 having the form depicted in FIG. 8 is put on a horizontal plane, the protrusion 15 has a form in which the protrusion 15 extends in a substantially horizontal direction. The shape of the protrusion is not limited to a particular shape, and the shape of the outline of the protrusion may have a square-cornered shape like a rectangle or a round shape with a curved line, for example.

When such a protrusion 15 is provided, as depicted in FIG. 8, the electronic device 70 may be placed on the protrusion 15. That is, the electronic device 70 may be provided on a base material surface provided by the protrusion 15. The two base material surfaces, each being provided by the protrusion 15, exist on a front side face and a rear side face, and the electronic device may be provided only on any one of these side faces or may be provided on both of these side faces.

In the embodiment in which the electronic device is provided on the protrusion 15, it is possible to orient the plurality of electronic devices 70 in a single direction in particular. Then, since the protrusion itself can maintain the orientation thereof substantially constant when the elastic flexible substrate 100 is expanded or made to contract, it is possible to maintain the orientations of the plurality of electronic devices 70 substantially constant without change before and after expansion or contraction. That is, in accordance with such an embodiment, it is possible to use the properties of the electronic devices more evenly.

Third Embodiment

Figure 9A:
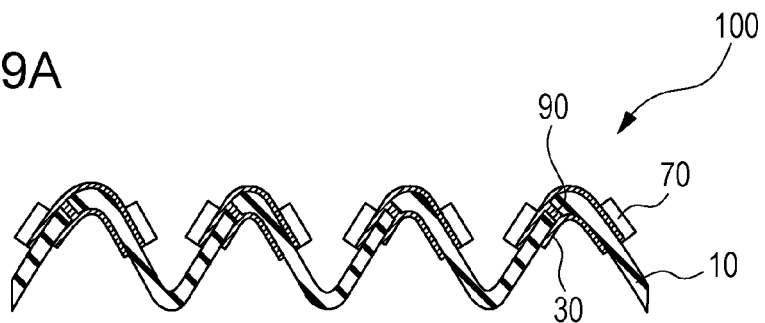
FIGS. 9A to 9C are cross sectional views schematically depicting the configuration of the elastic flexible substrate of the present disclosure, the elastic flexible substrate provided with vias, FIG. 9A being a diagram depicting a via formation mode in a "curved bellows shape", FIG. 9B being a diagram depicting a via formation mode in a "bent bellows shape", and FIG. 9C being a diagram depicting another via formation mode in the "curved bellows shape"
Figure 9B:
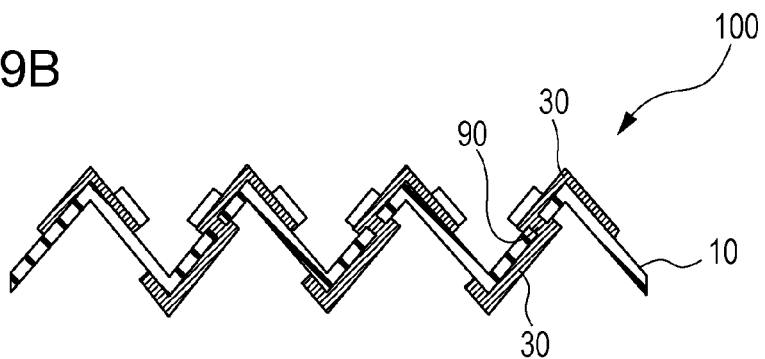
Figure 9C:
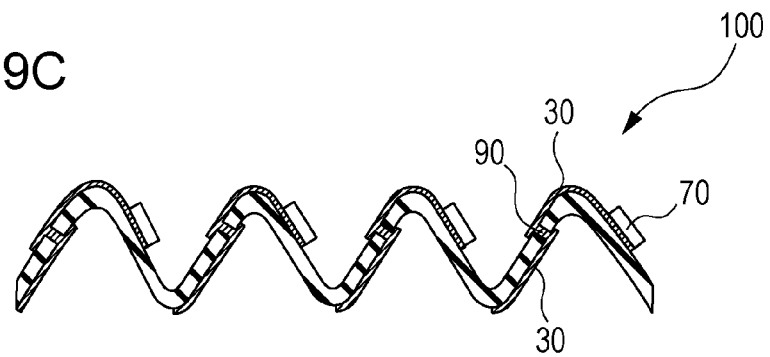

In FIGS. 9A to 9C, another embodiment of the elastic flexible substrate 100 of the present disclosure is depicted. In such embodiment, the elastic flexible substrate 100 further includes a via 90 provided in such a way as to penetrate the insulating film base material 10. That is, the via 90 functioning as a conductive portion in a thickness part of the insulating film base material 10 is formed. The wires 30 provided on both principal surfaces of the insulating film base material 10 may be connected to each other by the presence of such a via 90. Since the wires connected here include a wire for an electronic device, electrical connection (electrical connection that is established via both principal surfaces of the insulating film base material) for an electronic device, for example, is also established by the via 90.

In the embodiment in which the via 90 is provided, since it is possible to perform any one of wire formation and electronic device placement or both on not only one of the principal surfaces of the insulating film base material but also on the other principal surface, the flexibility of wire circuit design is increased. This makes it possible to implement a higher-performance elastic flexible substrate as a wiring substrate and a circuit substrate.

Fourth Embodiment

Figure 10:
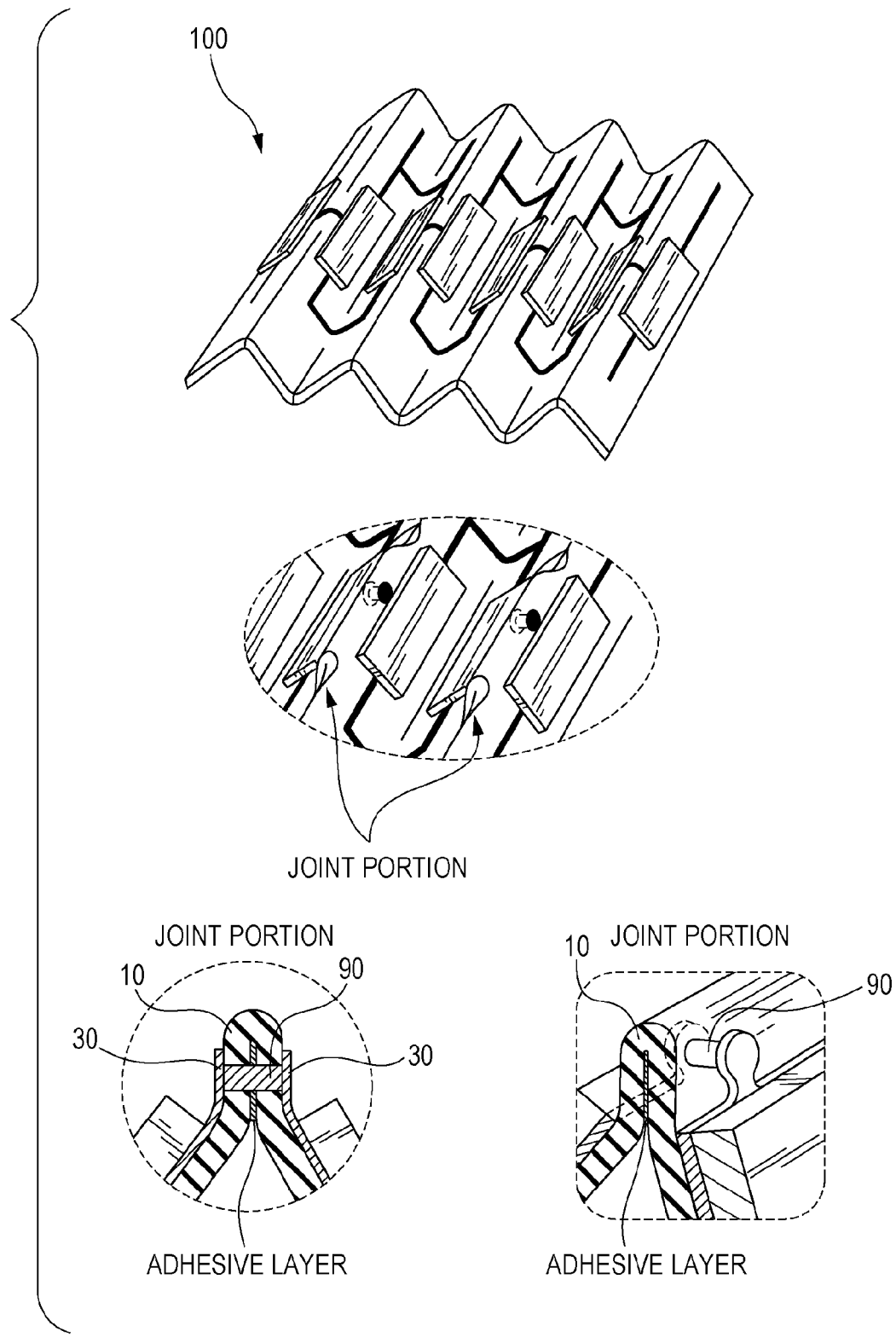
FIG. 10 is a perspective view and a cross sectional view schematically depicting a joint portion provided in the elastic flexible substrate of the present disclosure.

In FIG. 10, another embodiment of the elastic flexible substrate 100 of the present disclosure is depicted. In such embodiment, adjacent two faces of the faces forming the bellows portion of the insulating film base material 10 are partly joined. In other words, as depicted in FIG. 10, two local plane regions with a "bent spot" or a "most highly-curved spot" of the insulating film base material interposed therebetween are joined to each other. The presence of such a joint portion may produce the effect of increasing the structural strength of the insulating film base material having a bellows shape.

Since an adhesive can be used for joining these regions, an adhesive layer may exist in the joint portion. Here, the adhesive layer may contain a conductive material, and, in such a case, the joint portion can be used as a conduction path for a wire. On the other hand, if the adhesive layer has insulating properties, it is possible to use the joint portion for wire insulation. Furthermore, a via may be formed in the joint portion, and wires on adjacent two faces of the faces forming the bellows portion may be electrically connected to each other by such a via.

Method for Manufacturing the Elastic Flexible Substrate of the Present Disclosure Next, with reference to FIGS. 11A to 11D, a method for manufacturing the elastic flexible substrate of the present disclosure will be described. Manufacturing processes depicted in FIGS. 11A to 11D are processes of manufacturing an elastic flexible substrate provided with an electronic device, and a manufacturing method of the present disclosure will be described by taking up these processes as an example.

Figure 11A:
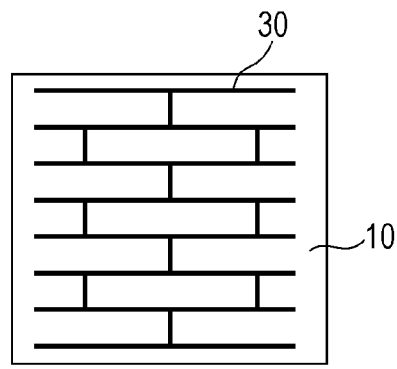
FIGS. 11A to 11D are schematic views depicting steps in a "method for manufacturing the elastic flexible substrate" of the present disclosure.

When the manufacturing method of the present disclosure is performed, first, as step (i), a wire 30 is formed on an insulating film base material 10 (see FIG. 11A). With the wire 30, it is possible to provide an intended conductor circuit. An area in which the wire is formed is a base material region which is different from a "base material region in which slits are to be formed".

The wire formation method is not limited to a particular method, and a common wire formation method may be adopted. For example, the wire 30 may be formed by a printing process or may be formed by vacuum vapor deposition, a sputtering method, or the like. The following is one specific example. The wire 30 may be formed by forming an Al film by a sputtering method using a mask.

The thickness of the wire 30 to be formed is in, for example, the range about 10 nm to about 1 μm or the range about 30 nm to about 500 nm (for example, about 100 nm).

Figure 11B:
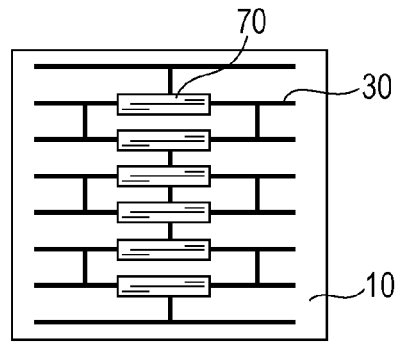

When an electronic device 70 is placed, as depicted in FIG. 11B, the electronic device 70 is provided on the insulating film base material 10. In particular, the electronic device 70 may be provided in such a way as to be electrically connected to the wire 30. As is the case with the wire formation, an area in which the electronic device 70 is placed is a base material region which is different from the "base material region in which slits are to be formed".

The electronic device 70 may be provided by mounting a ready-made electric device as it is or may be provided by forming an electric device on the insulating film base material by a printing process, vacuum vapor deposition, a sputtering method, or the like.

Figure 11C:
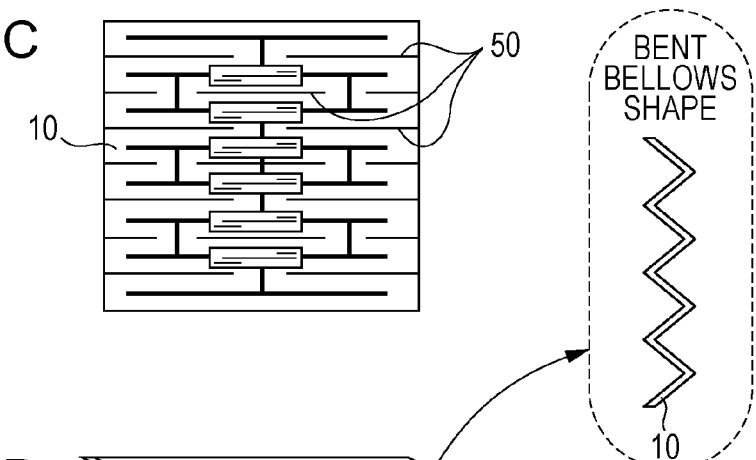

After the step (i), step (ii) is performed. That is, as depicted in FIG. 11C, a plurality of slits 50 are formed in the insulating film base material 10 with a predetermined space left therebetween.

The slit formation method is not limited to a particular method. For example, the slits may be formed by using a cutting means such as a cutter or performing laser processing or the like. Furthermore, the slits may be formed by boring holes locally in the insulating film base material.

In an embodiment, the slit formation is performed in such a way that two slits which are adjacent to each other are not aligned in a direction in which a plurality of slits are arranged with a predetermined space left therebetween (see FIG. 6B). Moreover, in another embodiment, at least two slits are formed in each "bent spot" obtained by bending the insulating film base material or each "most highly-curved spot" obtained by curving the insulating film base material (see FIG. 6C).

Figure 11D:
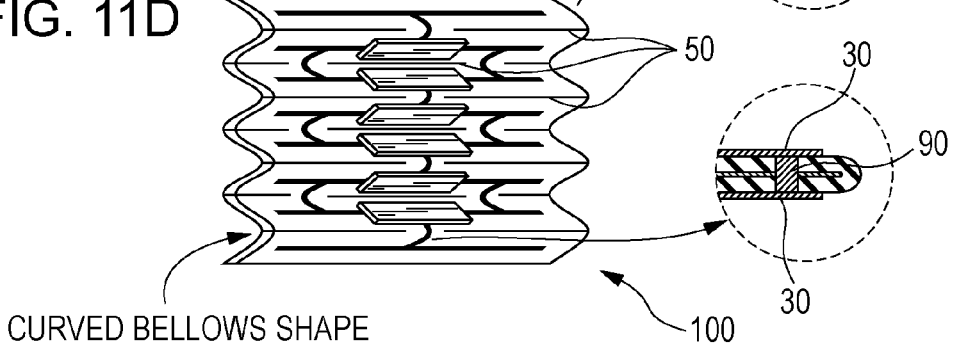

After the step (ii), step (iii) is performed. That is, as depicted in FIG. 11D, by using the slits 50 as base points, the insulating film base material 10 is bent or curved in such a way that the insulating film base material 10 has a bellows shape. In such a step, the slits are used to obtain a bellows shape, and the insulating film base material is bent or curved at the slit formation portion.

To maintain the bellows shape of the insulating film base material, at least one of heat treatment and pressure treatment may be performed. For example, the insulating film base material may be subjected to heat treatment after being bent. Alternatively, pressing, lamination, or the like may be performed on the insulating film base material.

As for the bellows shape, the gradient in the bellows is not limited to a particular gradient. For example, as for a specific gradient in the bellows portion, an angle α depicted in FIG. 1 may be about 30° to 130° or about 45° to 100° (in the case of the steep bellows portion, the angle α depicted in FIG. 1 may be less than 70°, for example, about 30° to 60°).

Through the steps (i) to (iii) described above, the elastic flexible substrate 100 can be eventually obtained.

The manufacturing method of the present disclosure may further include a step of forming a via that penetrates the insulating film base material. In such a case, the wires provided on both principal surfaces of the insulating film base material may be connected to each other via the via.

A more specific example will be described. By forming a hole for forming a via in the insulating film base material and filling the hole with a conductive material, it is possible to form a via. The hole itself for via formation may be formed by using a puncher or laser processing, for example. As an example (which is only an example, though), a conductive Ag paste may be used as the conductive material, and the hole for via formation may be filled with the Ag paste by operation by which the Ag paste is scraped off by a squeegee.

Moreover, the manufacturing method of the present disclosure may further include a step of partly joining adjacent two faces of the faces forming the bellows portion of the insulating film base material. That is, as depicted in areas enclosed by broken lines of FIG. 10, two local plane regions in a "bent spot" or a "most highly-curved spot" of the insulating film base material may be joined to each other with an adhesive or the like. In the embodiment depicted in the drawing, a via is formed in a joint portion, whereby the wires formed on the adjacent two faces are electrically connected to each other.

Furthermore, in the manufacturing method of the present disclosure, the slit formation in the step (ii) may be performed before the formation of a wire in the step (i). That is, the slits may be formed before the wire is formed on the insulating film base material. Also in such a case, it is possible to use the slits to obtain a bellows shape and bend or curve the insulating film base material at the slit formation portion. In the same manner, the slit formation may be performed before placement of an electronic device. That is, the slits may be formed before the electronic device is formed on the insulating film base material. In such a case, in particular, the slit formation may be performed before not only the electronic device but also the wire is formed on the insulating film base material.

Figure 12A:
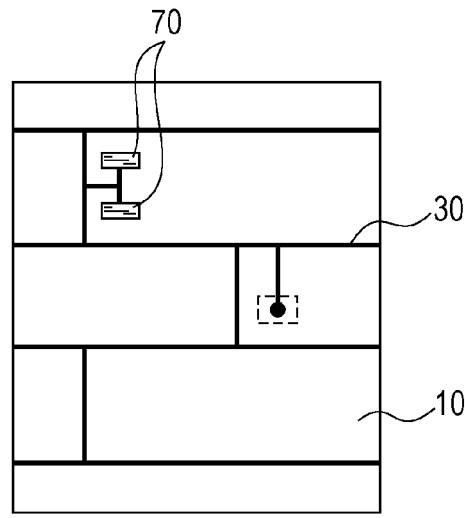
FIGS. 12A to 12C are schematic views depicting steps in a "method for manufacturing the elastic flexible substrate provided with the protrusions" of the present disclosure.
Figure 12B:
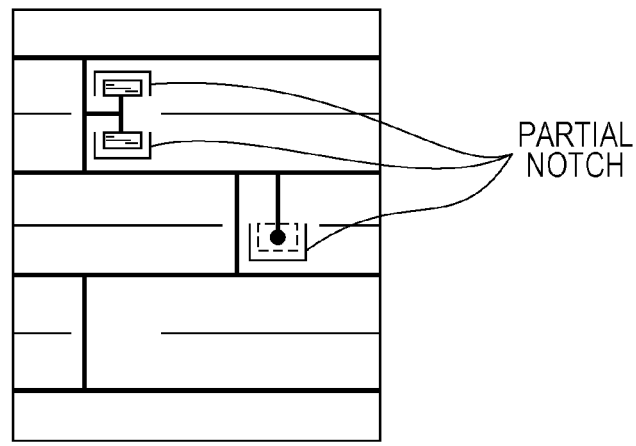
Figure 12C:
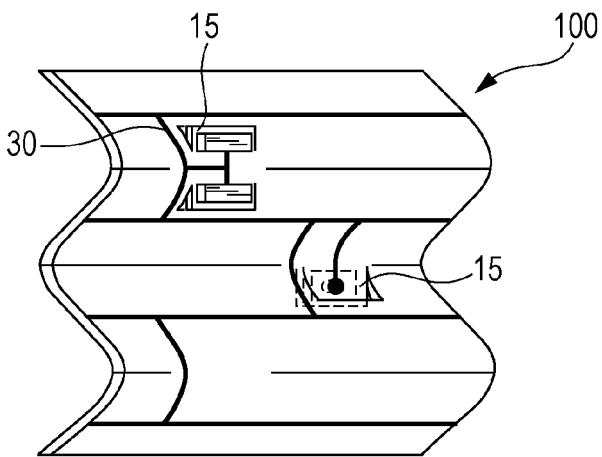

In FIGS. 12A to 12C, a method for manufacturing an elastic flexible substrate provided with a "protrusion" is depicted. The manufacturing method in such an embodiment further includes a step of forming a protrusion formed of a part of a principal surface of the insulating film base material. As depicted in FIG. 12B, after a notch is formed in a part of a principal surface of the insulating film base material 10, the part of the principal surface is bent as depicted in FIG. 12C, whereby the protrusion 15 is obtained.

In the embodiment in which the "protrusion" is formed, an electronic device may be provided in a part of the base material principal surface, the part which will become the protrusion. Since the protrusion may eventually have a form in which the protrusion protrudes outward from the insulating film base material having a bellows shape, it is possible to obtain a form in which the electronic device is provided on such a protrusion.

While the embodiment of the present disclosure has been described, the present disclosure is not limited thereto, and a person skilled in the art can easily understand that various modifications are possible.

EXAMPLES

An elastic flexible substrate was made in accordance with the present disclosure.

Example 1

As an insulating film base material, a polyimide film having a size of about 100 mm×about 100 mm was used. A wire is formed on such a polyimide film. Specifically, the wire was formed by forming an Al film by a sputtering method using a mask.

Then, an electronic device was provided on the polyimide film. Specifically, as luminescence devices, a plurality of LEDs were mounted on the polyimide film.

Then, slits were formed in the polyimide film with the wire and the LEDs provided thereon. Specifically, the slits were formed by forming notches, each having a length of about 10 mm, in the polyimide film.

A plurality of slits were formed at intervals of about 1 mm. Moreover, in each "bent spot" obtained by bending the polyimide film or each "most highly-curved spot" obtained by curving the polyimide film, at least two slits were formed at intervals of about 2 mm.

Then, by bending or curving the insulating film base material by using the slit formation portion as a base point, the polyimide film was processed into a bellows shape. At this time, heat treatment was performed on the polyimide film in order to maintain the bellows shape.

Through the steps described above, it was possible to obtain the elastic flexible substrate. When the elastic flexible substrate was expanded and made to contract with a current being applied thereto, it was confirmed that the LEDs lit up in a single direction with 200% or more expansion and contraction (the size of the expanded elastic flexible substrate was 200% or more of the elastic flexible substrate in an original state) being achieved.

Example 2

An elastic flexible substrate provided with a protrusion was made. In this example, when slits were formed, a notch was formed in a part of a principal surface of a polyimide film and the part of the principal surface was bent, whereby the protrusion was formed.

In particular, when the polyimide film was processed into a bellows shape, the polyimide film bent or curved by using the slit formation portion as a base point without fixing the portion where the protrusion was formed was fixed and subjected to heating.

By performing the steps similar to those of Example 1 other than such a protrusion formation step, the elastic flexible substrate was obtained.

Example 3

In this example, formation of an electronic device was performed on an insulating film base material. Specifically, by supplying a conductive Ag paste and an insulating fluororesin in such a way as to stack the conductive Ag paste and the insulating fluororesin by a screen printing method, an electronic device was formed on a polyimide film.

By performing the steps similar to those of Example 1 other than such an electronic device formation step, an elastic flexible substrate was obtained. When the obtained elastic flexible substrate was expanded and made to contract, it was confirmed that 200% or more expansion and contraction (the size of the expanded elastic flexible substrate was 200% or more of the elastic flexible substrate in an original state) was achieved and the electronic device portion exhibited conductivity.

Example 4

In this example, a via was formed in an insulating film base material. Specifically, a via was first formed in a polyimide film by a puncher. Then, the via was filled with a conductive Ag paste by using a squeegee.

When the polyimide film was processed into a bellows shape, two vias were connected to each other with a conductive adhesive. Specifically, the conductive adhesive was put on the back of the via by a screen printing method, whereby the two vias were connected to each other.

By performing the steps similar to those of Example 3 other than such a via formation step, an elastic flexible substrate was obtained. When the obtained elastic flexible substrate was expanded and made to contract, it was confirmed that 150% or more expansion and contraction (the size of the expanded elastic flexible substrate was 150% or more of the elastic flexible substrate in an original state) was achieved and the electronic device portion and the via portion exhibited conductivity.

The present disclosure includes the following aspects.

An elastic flexible substrate of one aspect of the present disclosure includes an insulating film base material and a wire provided on the insulating film base material, in the insulating film base material, a plurality of slits are provided with a predetermined space left therebetween, the insulating film base material has a bellows shape in which the insulating film base material is bent or curved by using the slits as base points, and the slits are deformed when the insulating film base material is stretched.

In accordance with the one aspect described above, since the insulating film base material has a bellows shape in which the insulating film base material is bent or curved by using the slits provided in the insulating film base material as base points and the slits are deformed when the insulating film base material is stretched, the expansion and contraction properties are obtained.

For example, in the elastic flexible substrate of the one aspect described above, the slits may be opened when the insulating film base material is stretched.

For example, in the elastic flexible substrate of the one aspect described above, shapes of openings of the slits may be deformable with the expansion and contraction of the insulating film base material.

For example, in the elastic flexible substrate of the one aspect described above, two slits which are adjacent to each other may not be aligned in a direction in which the plurality of slits are arranged with the predetermined space left therebetween.

For example, in the elastic flexible substrate of the one aspect described above, at least two slits may be provided in each of a bent spot or a most highly-curved spot of the insulating film base material.

For example, the elastic flexible substrate of the one aspect described above may further include an electronic device provided on the insulating film base material.

For example, the elastic flexible substrate of the one aspect described above may further include a protrusion formed by cutting and bending a part of a principal surface of the insulating film base material.

For example, in the elastic flexible substrate of the one aspect described above, the electronic device may be provided on the protrusion.

For example, the elastic flexible substrate of the one aspect described above may further include a via penetrating the insulating film base material, and the insulating film base material has two principal surfaces and the wire provided on one principal surface of the two principal surfaces of the insulating film base material and the wire provided on the other principal surface of the two principal surfaces may be connected to each other by the via.

For example, a method for manufacturing an elastic flexible substrate of another aspect of the present disclosure includes: (i) forming a wire on an insulating film base material; (ii) forming a plurality of slits in the insulating film base material with a predetermined space left therebetween; and (iii) processing the insulating film base material into a bellows shape by bending or curving the insulating film base material by using the slits as base points.

For example, in the method for manufacturing an elastic flexible substrate of the other aspect of the present disclosure, two slits which are adjacent to each other may be formed so as not to be aligned in a direction in which the plurality of slits are arranged with the predetermined space left therebetween.

For example, in the method for manufacturing an elastic flexible substrate of the other aspect of the present disclosure, at least two slits may be formed in each of a bent spot obtained by bending the insulating film base material or a most highly-curved spot obtained by curving the insulating film base material.

For example, the method for manufacturing an elastic flexible substrate of the other aspect of the present disclosure may further include providing an electronic device on the insulating film base material.

For example, the method for manufacturing an elastic flexible substrate of the other aspect of the present disclosure may further include forming a protrusion formed of a part of a principal surface of the insulating film base material, and the protrusion may be formed by forming a notch in a part of the principal surface of the insulating film base material and bending the part of the principal surface.

For example, in the method for manufacturing an elastic flexible substrate of the other aspect of the present disclosure, the electronic device may be formed in the part of the principal surface, the part becoming the protrusion.

For example, in the method for manufacturing an elastic flexible substrate of the other aspect of the present disclosure, the formation of the slits in the step (ii) may be performed before the formation of the wire in the step (i).

The elastic flexible substrate of the present disclosure can be used as a wiring substrate and a circuit substrate which have expansion and contraction properties and flexibility properties.

What is claimed is:

1. An elastic flexible substrate comprising:
   an insulating film base material; and
   a wire provided on the insulating film base material, wherein:
   in the insulating film base material, a plurality of slits each formed to extend in a width direction of the insulating film base material are provided with a predetermined space left therebetween in a length direction of the insulating film base material; and
   the insulating film base material has a bellows shape in which the insulating film base material is bent or curved about the slits as base points so that adjacent slits of the plurality of slits are offset from each other in a direction perpendicular to the width and length directions.

2. The elastic flexible substrate according to claim 1, wherein
   the slits are opened when the insulating film base material is stretched.

3. The elastic flexible substrate according to claim 1, wherein
   two slits which arc adjacent to each other are not aligned in a direction in which the plurality of slits are arranged with the predetermined space left therebetween.

4. The elastic flexible substrate according to claim 1, wherein
   at least two slits are provided in each of a bent spot or a most highly-curved spot of the insulating film base material.

5. The elastic flexible substrate according to claim 1, further comprising:
   an electronic device provided on the insulating film base material.

6. The elastic flexible substrate according to claim 1, further comprising:
   a via penetrating the insulating film base material, wherein:
   the insulating film base material has two principal surfaces; and
   the wire provided on one principal surface of the two principal surfaces of the insulating film base material and the wire provided on the other principal surface of the two principal surfaces are connected to each other by the via.

7. The elastic flexible substrate according to claim 1, wherein:
   the bellows shape includes a peak portion and a bottom portion; and
   the slits are located in the peak portion and the bottom portion.

8. The elastic flexible substrate according to claim 2, wherein
   shapes of openings of the slits are deformable with expansion and contraction of the insulating film base material.

9. The elastic flexible substrate according to claim 5, further comprising:

a protrusion formed by cutting and bending a part of a principal surface of the insulating film base material.

10. The elastic flexible substrate according to claim 9, wherein
the electronic device is provided on the protrusion.

11. A method for manufacturing an elastic flexible substrate, the method comprising:
(i) forming a wire on an insulating film base material;
(ii) forming a plurality of slits in the insulating film base material, each of the plurality of slits formed to extend in a width direction of the insulating film base material with a predetermined space left therebetween in a length direction of the insulating film base material; and
(iii) processing the insulating film base material into a bellows shape by bending or curving the insulating film base material about the slits as base points so that adjacent slits of the plurality of slits are offset from each other in a direction perpendicular to the width and length directions.

12. The method for manufacturing an elastic flexible substrate according to claim 11, wherein
two slits which are adjacent to each other are formed so as not to be aligned in a direction in which the plurality of slits are arranged with the predetermined space left therebetween.

13. The method for manufacturing an elastic flexible substrate according to claim 11, wherein
at least two slits are formed in each of a bent spot obtained by bending the insulating film base material or a most highly-curved spot obtained by curving the insulating film base material.

14. The method for manufacturing an elastic flexible substrate according to claim 11, further comprising:
providing an electronic device on the insulating film base material.

15. The method for manufacturing an elastic flexible substrate according to claim 11, further comprising:
forming a protrusion formed of a part of a principal surface of the insulating film base material, wherein
the protrusion is formed by forming a notch in a part of the principal surface of the insulating film base material and bending the part of the principal surface.

16. The method for manufacturing an elastic flexible substrate according to claim 11, wherein
formation of the slits in the step (ii) is performed before formation of the wire in the step (i).

17. The method for manufacturing an elastic flexible substrate according to claim 15, wherein
the electronic device is provided in the part of the principal surface, the part becoming the protrusion.

* * * * *